United States Patent [19]

Maue et al.

[11] Patent Number: 4,689,718

[45] Date of Patent: Aug. 25, 1987

[54] PROGRAMMABLE JUNCTION BOX

[75] Inventors: H. Winston Maue, Northville; Brian E. Henderson; Robert G. Szudarek, both of Warren, all of Mich.

[73] Assignee: United Technologies Automotive, Inc., Dearborn, Mich.

[21] Appl. No.: 848,673

[22] Filed: Apr. 4, 1986

[51] Int. Cl.[4] .......................... H02B 1/04; H02B 1/08; H02B 1/18
[52] U.S. Cl. ..................................... 361/360; 361/395
[58] Field of Search .............. 361/358, 359, 360, 361, 361/395, 399, 407; 174/68 B, 71 B; 339/156, 19

[56] References Cited

U.S. PATENT DOCUMENTS

| | | | |
|---|---|---|---|
| 3,471,822 | 10/1969 | Van Baelen | 339/18 |
| 3,917,371 | 11/1975 | Hirokawa et al. | 339/19 |
| 4,135,226 | 1/1979 | Kourinsky | 361/415 |
| 4,208,080 | 6/1980 | Teagno | 339/18 B |
| 4,464,003 | 8/1984 | Goodman et al. | 339/99 R |
| 4,487,464 | 12/1984 | Kirschenbaum | 339/19 |
| 4,552,423 | 11/1985 | Swengel, Jr. | 339/19 |
| 4,555,638 | 11/1985 | Lobe | 361/360 |
| 4,599,679 | 7/1986 | Baader | 361/361 |

*Primary Examiner*—Roy N. Envall, Jr.
*Attorney, Agent, or Firm*—Lloyd D. Doigan

[57] ABSTRACT

An automobile junction box (2), programmable in relation to vehicle options that may be required, houses printed circuit boards (24, 25) having receptacles (28) for receiving tabs (36) depending from an elongated member (34). The tabs connect the circuit pathways (26) corresponding to vehicle options. The selected circuit pathways may be modified by the inclusion of a second set of receptacles (29) on the printed circuit boards for receiving electrical components (14) such as diodes, resistors, zener diodes and the like.

7 Claims, 5 Drawing Figures

PROGRAMMABLE JUNCTION BOX

TECHNICAL FIELD

This invention relates generally to automobile wiring and particularly to automobile junction boxes.

BACKGROUND ART

Before the introduction of junction box technology, wire harnesses for each automobile had to be individually tailored for particular vehicle options. Wire harnesses were overly complex, required unreliable and costly splicing, and necessitated high labor costs. Achieving standardization of vehicle wiring and the concomitant savings associated therewith, such as high reliability and low labor and supply costs, was impossible.

With the introduction of printed circuit junction boxes, wire harness complexity and cost were reduced since the junction boxes provided a plurality of previously individually wired pathways for the centralized distribution of electrical signals. Wire harness standardization was possible to a limited extent, yet individual wire harnessing was still reguired for various vehicle options, particularly those requiring additional electrical components for proper operation. The electrical components (such as a diode) were generally hard wired into an appropriate harness causing the harnesses to be bulky, difficult to service and install, and of little use for other vehicle options. Because of the individual wiring reguired, complete standardization of automobile wiring has not been achieved; various wire harnesses are required, and junction boxes require differing internal circuitry or complicated external connections to accommodate each vehicle option.

The prior art addresses the problem of standardization by attempting to make junction boxes more flexible to accommodate standardized harnesses and available options. U.S. Pat. No. 4,208,080 to Teagno dislcoses a junction box housing printed circuit boards connected by a plurality of individual stakes that are used to accommodate different vehicle functions by connecting the appropriate circuit paths imprinted in the circuit boards. The box is complicated, has a high margin for error (particularly relating to misinsertion of the stakes), and insertion of the stakes requires a great deal of labor. U.S. Pat. No. 4,552,423 to Swengel, Jr., discloses a single programmable shunt (11) having prongs (13) to provide multiple connections between a socket (25) and selected terminals to connect a selected circuit. However, the shunt is made of a conducting material which limits its ability to connect more than one discrete circuit. Similarly, U.S. Pat. No. 4,464,003 to Goodman et al., discloses a programmable bus bar (20) made of a conductive material to interconnect selected of conductors (18). The bus bar can only interconnect one discrete circuit. U.S. Pat. No. 4,487,464 to Kirschenbaum discloses a plurality of different bus bars (23, 30, 33, 40, 43) making the required electrical connections for a plurality of discrete circuits. A different bus is required to connect each discrete circuit, engendering high labor costs and high probability for error particulary relating to the insertion (or misinsertion) of each bus.

DISCLOSURE OF INVENTION

It is therefore an object of the invention to simplify the interconnection of wires and other electrical components in vehicles when different vehicle options are required.

It is a further object of the invention to standardize the circuitry of a junction box.

It is a further object of the invention to minimize wire harness complexity.

These and other objects of the invention are provided by a bus bar comprised of an elongated, electrically insulative member having a plurality of electrically insulative tabs attached directly to one side of the member, arranged at selected longitudinal locations on the member to mate with selected of a first set of receptacles within a standardized printed circuit junction box. The electrodes interconnect selected printed circuit pathways attaching to the first set of receptacles to accommodate particular vehicle options. The circuit pathways may have a second set of receptacles to receive electrical components that provide the proper electrical characteristics to the pathways chosen for each vehicle option.

BEST MODE FOR CARRYING OUT THE INVENTION

Figure 1:
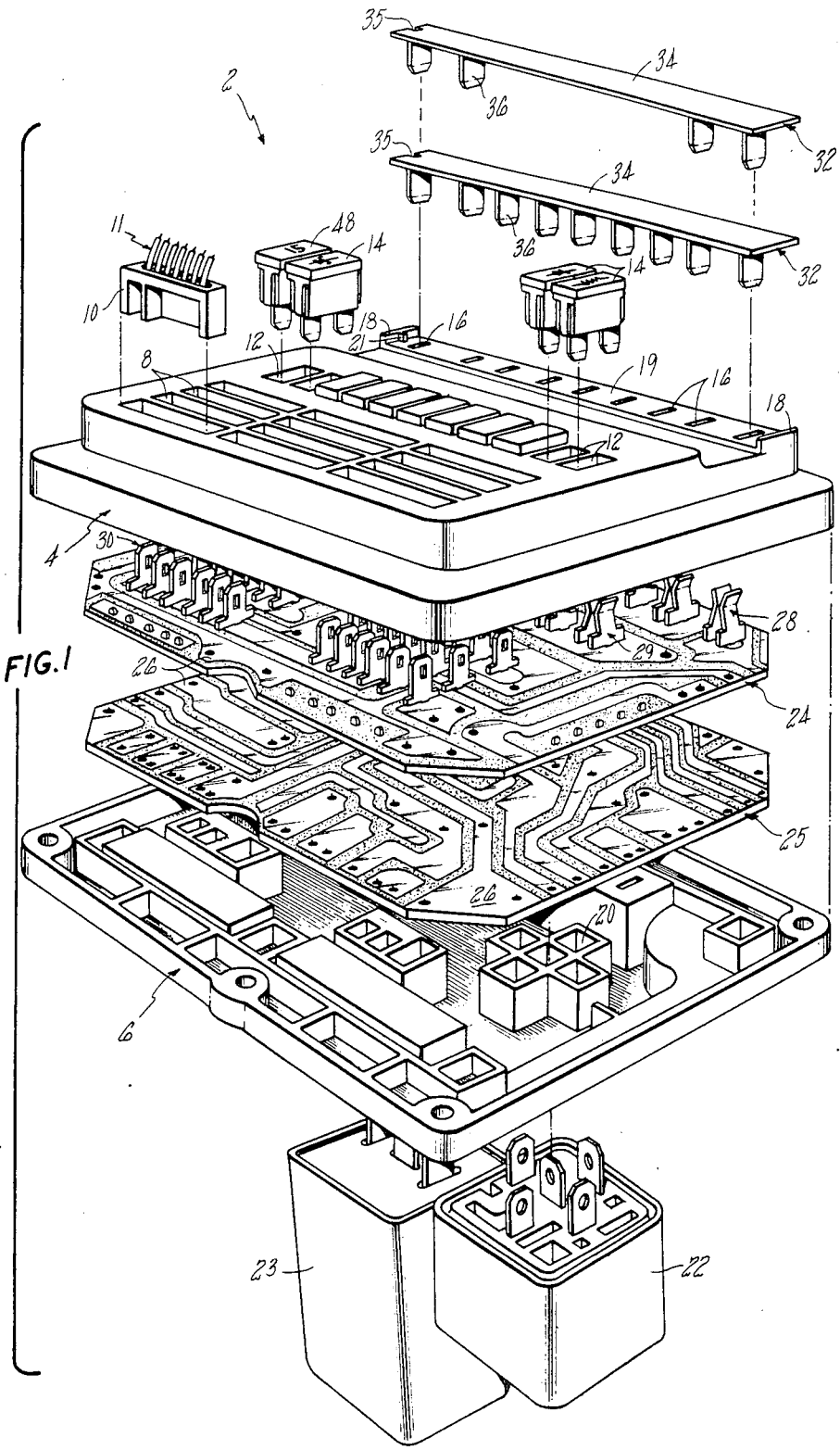
FIG. 1 is an exploded perspective view of the junction box of this invention.

Referring generally to FIG. 1, a junction box 2 for providing electrical connections for automobile wiring has a two part housing 4, 6, each part having holes for the interconnection of various electrical elements to the box.

Top part 4 includes a plurality of identical rectangular openings 8 for receiving standardized wire harness connectors 10 that provide connections for standardized wire harnesses 11 terminating in each connector 10. Top part 4 has a row of juxtaposed inlets 12 parallel to wire harness openings 8 for receiving electrical components 14. Closely contiguous to the electrical component inlets 12 are programming slots 16 for receiving a bus bar 32 the slots being arranged parallel to each other in an elongated row. Abutment stops 18 protrude from a surface 19 of the top part 4, at each end of the row. One stop 18 has a polarizing rib extending toward the other stop. Bottom part 6 of the junction box has apertures 20 for the interconnection between relays 22 and/or electrical/electronic module 23 and the junction box. The junction box parts are joined by any known means such as screws or snaps (not shown).

Housed within the junction box, are two, stacked printed circuit boards 24, 25 joined electrically by any known means. The printed circuit boards have conductive pathways imprinted thereon (shown generally at 26), electrically joining the appropriate elements for the distribution of electrical signals to or from vehicle options. Each circuit board has a plurality of terminals aligned with the appropriate hole in each part of the junction box to electrically connect the inserted elements to the circuit pathways. Board 24 has a set of female terminals 28 aligning with slots 16, a second set of female terminals 29 aligning with inlets 12 and a set of male plugs 30 aligning with openings 8. Board 25 has a set of female receptacles (not shown) aligning with apertures 20.

Figure 2:
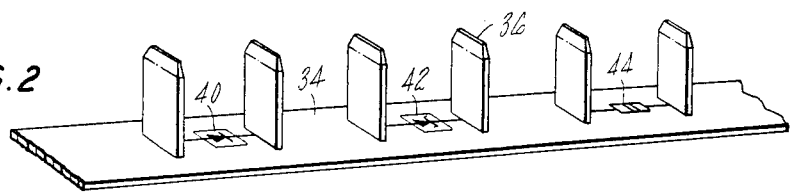
FIGS. 2-5 are perspective views, partly broken away, of a bus bar according to different aspects of this invention.
Figure 3:
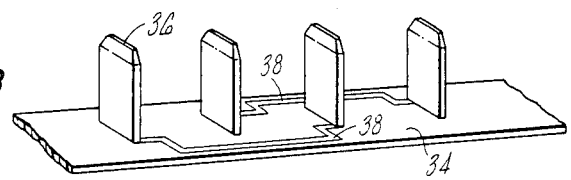
Figure 4:
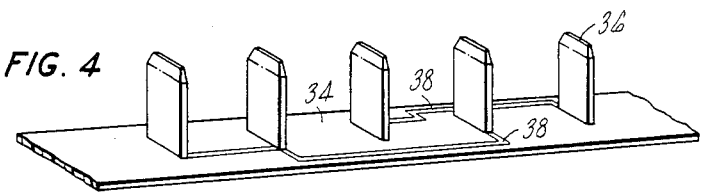
Figure 5:
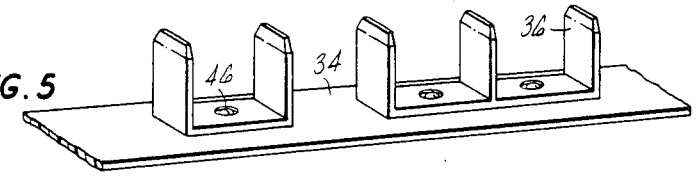

A bus bar 32 is provided to electrically join selected circuit pathways 26 corresponding to a vehicle's options, thereby programming the junction box for the distribution of electrical signals to these options. The bar has an elongated, rectangular member 34 constructed of an electrically insulative material, such as a plastic. The length of the member corresponds to the length of the row of programming slots 16, and fits firmly between the abutment stops 18 to ensure proper alignment of the member 34 in relation to the slots 16. One end of member 34 has a polarizing notch 35 for mating with rib 21, thereby ensuring that the member is not inserted between the stops 18 in a reverse manner. The member has a series of electrically conductive tabs 36 depending from one side thereof. The tabs 36 are arranged at selected locations on the member to fit within the programming slots and to connect selected circuit pathways by means of the female receptacles 28. Each tab may connect circuit pathways by connecting separated female terminal electrodes (shown generally as a receptacle at 28), each electrode corresponding to a separate circuit pathway, or may join two or more circuit pathways by establishing electrical connection between each tab and the circuit pathways corresponding to each receptacle 28. The tabs may be connected by circuits 38 printed on the face of the member (see FIGS. 3 and 4), or the depending tabs may be integrally connected to provide the proper connection (see FIG. 5). In a further embodiment, the tabs may be electrically connected by electrical components such as diodes 40, zener diodes 42 or resistors 44 to modify the connected circuits to properly operate the selected options (see FIG. 2). The tabs may be connected to the member by pins 46 projecting from the member fitting through holes in the tabs (see FIG. 5) or by spot welding.

Electrical components 14 may also be inserted in the junction box through the electrical component inlets 12 into the appropriate printed circuit female receptacles 28. The electrical components 14, such as zener diodes, diodes and resistors, which may be polarized for proper orientation within a circuit, ensure that the option chosen has the correct circuitry characteristics for proper operation. Fuses 48, shaped similarly to the electrical components 14, may be inserted in the electrical component inlets 12 to ensure that a vehicle's options are properly protected. Other electrical components (not shown) such as filters, capacitors and the like may also be inserted therein to properly operate the selected circuits.

In operation, each automobile receives an indentical junction box having circuit boards therein for accommodating a range of available options. A bus bar 32 corresponding to particular vehicle options is inserted into the slots 16 provided in the junction box and into the corresponding female receptacles 28 joining the conductive pathways corresponding to the vehicle's options. The circuits that require particular characteristics are modified by electrical components 14 (or fuses 48) inserted through the inlets 12 into receptacles 29. The appropriate relays and electrical/electronic modules are inserted into the box through apertures 20. The wire harness connectors 10 are inserted through openings 8 to engage plugs 30. Assembly is then complete.

Harnesses and connectors can be standardized because each harness can service a variety of options due to the circuit flexibility of the junction box and the inclusion of the circuit modifying elements in the box. For instance, a manually regulated air conditioning system might require one connecting circuit while an automatically regulated air conditioning system, which requires sensor input, would require another connecting circuit. The bus bar would connect the proper circuit to the appropriate wire harness through the appropriate pathways, but in either case, the same wires in that harness carry the appropriate electrical signals to the air conditioner. This is particularly true if one system or the other requires additional electrical components. The required component is included in the box or on the member 34 so that an identical harness, now less complex, may still service either option in other vehicles.

Accordingly, what is provided is a standardized, simplified, wiring system for an automobile, having a standardized junction box with sufficient flexibility, provided by a single, easy to install bus bar, to accommodate the various options that may be required in a vehicle through standardized, less complex wire harnesses.

It should be understood that the invention is not limited to the particular embodiments shown and described herein, but that various changes and modifications may be made without departing from the spirit and scope of the invention as defined by the following claims.

We claim:

1. A programmable automobile junction box characterized by:
   printed circuit pathways within said box, said circuit pathways providing electrical connections for electrical harnessess attaching to said junction box,
   a first set of receptacles electrically connected to said circuit pathways forming terminals thereon for joining selected configurations of said circuit pathways;
   an elongated, electrically insulative member, and
   a plurality of electrically conductive tabs directly connected to and depending from one side of said member arranged at selected locations thereon to mate with selected of said recepatacles to electrically interconnect selected of said circuit pathways within said box.

2. The box of claim 1, wherein said circuit pathways are further characterized by:
   a second set of receptacles electrically connected to said circuit pathways forming terminals thereon for receiving electrical components to modify electrical characteristics of said selected configurations of said circuit pathways.

3. The box of claim 2, said components being characterized as any of a group consisting of a resistor, diode or zener diode.

4. The box of claim 1, wherein said elongated member is further characterized by:
   electrically conductive paths imprinted within said member for connecting selected tabs depending from said member.

5. The box of claim 1, wherein said member is further characterized by selected of said tabs being electrically interconnected.

6. The box of claim 5, wherein said tabs are further characterized as being electrically interconnected by electrical components.

7. The box of claim 6, wherein said circuit pathways are further characterized by:
   a second set of receptacles electrically connected to said circuit pathways forming terminals thereon for receiving electrical components to modify electrical characteristics of said selected configurations of said circuit pathways.

* * * * *